United States Patent [19]
Dunlop et al.

[11] Patent Number: 5,809,393
[45] Date of Patent: Sep. 15, 1998

[54] SPUTTERING TARGET WITH ULTRA-FINE, ORIENTED GRAINS AND METHOD OF MAKING SAME

[75] Inventors: John Alden Dunlop, Veradale, Wash.; Jun Yuan, Santa Clara, Calif.; Janine Kiyabu Kardokus, Otis Orchards, Wash.; Roger Alan Emigh, Post Falls, Id.

[73] Assignee: Johnson Matthey Electronics, Inc., Spokane, Wash.

[21] Appl. No.: 544,970

[22] Filed: Oct. 30, 1995

Related U.S. Application Data

[62] Division of Ser. No. 363,397, Dec. 23, 1994, Pat. No. 5,590,389.

[51] Int. Cl.$^6$ ............... C22C 1/04; C22C 21/00; B22F 3/02; B22F 5/00
[52] U.S. Cl. ............... 419/61; 75/232; 75/249; 75/340; 419/66; 420/529; 420/537; 420/538; 420/548; 420/550; 420/551; 420/552
[58] Field of Search ............ 419/61, 66; 75/232, 75/249, 340; 420/529, 537, 538, 548, 550, 551, 552

[56] References Cited

U.S. PATENT DOCUMENTS

| | | | |
|---|---|---|---|
| 4,016,738 | 4/1977 | Puchko et al. | 72/90 |
| 4,198,283 | 4/1980 | Class et al. | 204/298 |
| 4,889,772 | 12/1989 | Bergmann et al. | 428/547 |
| 4,961,831 | 10/1990 | Bergmann et al. | 204/192.16 |
| 4,961,832 | 10/1990 | Shagun et al. | 204/298.07 |
| 4,963,239 | 10/1990 | Shimamura et al. | 204/192.12 |
| 4,963,240 | 10/1990 | Fukasawa et al. | 204/192.15 |
| 4,964,962 | 10/1990 | Nobutani et al. | 204/192.3 |
| 4,964,968 | 10/1990 | Arita | 204/298.19 |
| 4,964,969 | 10/1990 | Kusakabe et al. | 204/298.12 |
| 4,966,676 | 10/1990 | Fukasawa et al. | 204/298.12 |
| 4,971,674 | 11/1990 | Hata | 204/192.12 |
| 5,087,297 | 2/1992 | Pouliquen | 148/2 |
| 5,400,633 | 3/1995 | Segal et al. | 72/272 |
| 5,590,389 | 12/1996 | Dunlop et al. | 419/67 |

FOREIGN PATENT DOCUMENTS

| | | | |
|---|---|---|---|
| 0281141 | 9/1988 | European Pat. Off. | C23C 14/34 |
| 61-139637 | 6/1986 | Japan | C22C 30/00 |
| 3002369 | 1/1991 | Japan | C23C 14/34 |
| 371510 | 3/1991 | Japan . | |
| 4103758 | 4/1992 | Japan | C23C 14/14 |
| 492780 | 2/1976 | Russian Federation . | |
| 515968 | 6/1976 | Russian Federation . | |
| 563208 | 7/1977 | Russian Federation . | |
| 902962 | 2/1982 | Russian Federation . | |
| 1140870 | 2/1985 | Russian Federation . | |
| WO9201080 | 1/1992 | WIPO | C23C 14/34 |

OTHER PUBLICATIONS

V.M. Segal, "Working of Metals By Simple Shear Deformation Process", pp. 403–406.

V.M. Segal, "The Metalworking Process To Advance Materials", pp. 88–89.

V.M. Segal, et al., "Thermomechanical Treatment of the Elinvar Alloy 44NKhMT Using Plain Shear", pp. 706–710.

V.M. Segal, et al., "Plastic Working of Metals By Simple Shear", pp. 99–105.

(List continued on next page.)

*Primary Examiner*—Charles T. Jordan
*Assistant Examiner*—Daniel Jenkins
*Attorney, Agent, or Firm*—Christie, Parker & Hale, LLP

[57] ABSTRACT

A sputtering target comprising a body of metal such as aluminum and its alloy with an ultrafine grain size and small second phase. Also described is a method for making an ultra-fine grain sputtering target comprising melting, atomizing, and depositing atomized metal to form a workpiece, and fabricating the workpiece to form a sputtering target. A method is also disclosed that includes the steps of extruding a workpiece through a die having contiguous, transverse inlet and outlet channels of substantially identical cross section, and fabricating the extruded article into a sputtering target. The extrusion may be performed several times, producing grain size of still smaller size and controlled grain texture.

17 Claims, 9 Drawing Sheets

Liquid Dynamic Compaction
100x

Al + 0.5% Zr

OTHER PUBLICATIONS

V.M. Segal, et al., "The Application of Equal Channel Angular Extrusion to Produce Extraordinary Properties in Advanced Metallic Materials", First International Conference on Processing Materials for Properties, The Minerals, Metals & Materials Society (1993), pp. 971–974.

V.M. Segal, et al., Simple Shear as a Metal Working Process for Advanced Materials Technology First International Conference on Processing Materials for Properties, The Minerals, Metals & Materials Society (1993), pp. 947–950.

N.J. Grant, "Recent Trends and Developments with Rapidly Solidified Materials", *Metallurgical Transactions A*, vol. 23A, Apr. 1992, pp. 1083–1093.

E. Lavernia, et al., "Structure and Properties of the Lithium Containing X2020 Aluminum Alloys Produced by Liquid Dynamic Compaction", Rapid Solid Material Processing International Conference (1986) pp. 29–43.

J. Dunlop, "Trip Report—PMP (Processing Materials for Properties) Conference", Nov. 1993, pp. 1–7.

File Metadex, pp. 1–16.

J. Yuan, "Update on Application of Equal Channel Angular Extrusion Method to Our A1 Targets" Jan. 1994, pp. 1–8.

Search Report, (Segal V), Derwent Information Ltd., 1995 (12 pages).

Collective *Official Gazette*, Patents Issued Section, related to U.S. Patent No.s 3,107,787; 3,161,756; and 3,922,898 (5 pages).

*Paul S. Gilman, "Structurally Controlled Sputtering Targets", *Semiconductor Fabtech*, 1995 (5 pages).

Liquid Dynamic Compaction
100x

Continuous Cast Aluminum
100x

Al + 0.5%Cu

Orientation Distribution Functions From as Sprayed LDC Material

Standard Deformation and Recrystallization
100x

Al + 0.5%Cu

Equal Channel Angular Extrusion 100x

TEXTURES FROM ECAE EXPERIMENT 1

% INTENSITY

SPUTTERING TARGET WITH ULTRA-FINE, ORIENTED GRAINS AND METHOD OF MAKING SAME

This application is a divisional application of U.S. patent application No. 08/363,397, filed Dec. 23, 1994, now U.S. Pat. No. 5,590,389.

BACKGROUND OF THE INVENTION

It is well known that thin metallic and ceramic layers may be deposited upon a substrate by a technique known as "sputtering". By such methods, a metal layer may be sputtered in an argon atmosphere from a target of the material to be deposited, generally as a cathode in a standard RF and/or DC sputtering apparatus.

More recently, sputtering techniques have been used in the production of integrated circuits which require rapid and economical metal deposition with metal line widths and spaces less than 1 micron. Sputtering is an especially useful tool for the application of films and coatings where uniformity and chemical purity are important. Manufacturing costs may be lowered by improving film uniformity and deposition rate in high speed production processes typically used in integrated circuit manufacturing. Materials of particular importance in the manufacture of integrated circuits are aluminum, copper, titanium, tungsten, and their alloys. Targets of these materials are used to produce a metal or intermetallic film or coating on a substrate by sputtering.

Illustrative sputtering processes and apparatus with which the invention may be usable are disclosed in Bergmann, et al., U.S. Pat. Nos. 4,889,772 and 4,961,831; Shagun, et al., U.S. Pat. No. 4,961,832; Shimamura, et al., U.S. Pat. No. 4,963,239; Nobutani, et al., U.S. Pat. No. 4,964,962; Arita, U.S. Pat. No. 4,964,968; Kusakabe, et al., U.S. Pat. No. 4,964,969 and Hata, U.S. Pat. No. 4,971,674; and the references referred to therein; sputtering targets are discussed also in Fukaswawa, et al. U.S. Pat. Nos. 4,963,240 and 4,966,676; and Archut, et al., U.S. Pat. No. 4,966,676. These disclosures of sputtering processes and apparatus as well as sputtering targets are expressly incorporated herein by reference.

Given the importance of high deposition rates and film uniformity to economical production of high quality integrated circuits, investigations have been undertaken to consider the relationship between the nature of the sputtering target and the nature of the resulting deposited layer.

Figure 1:
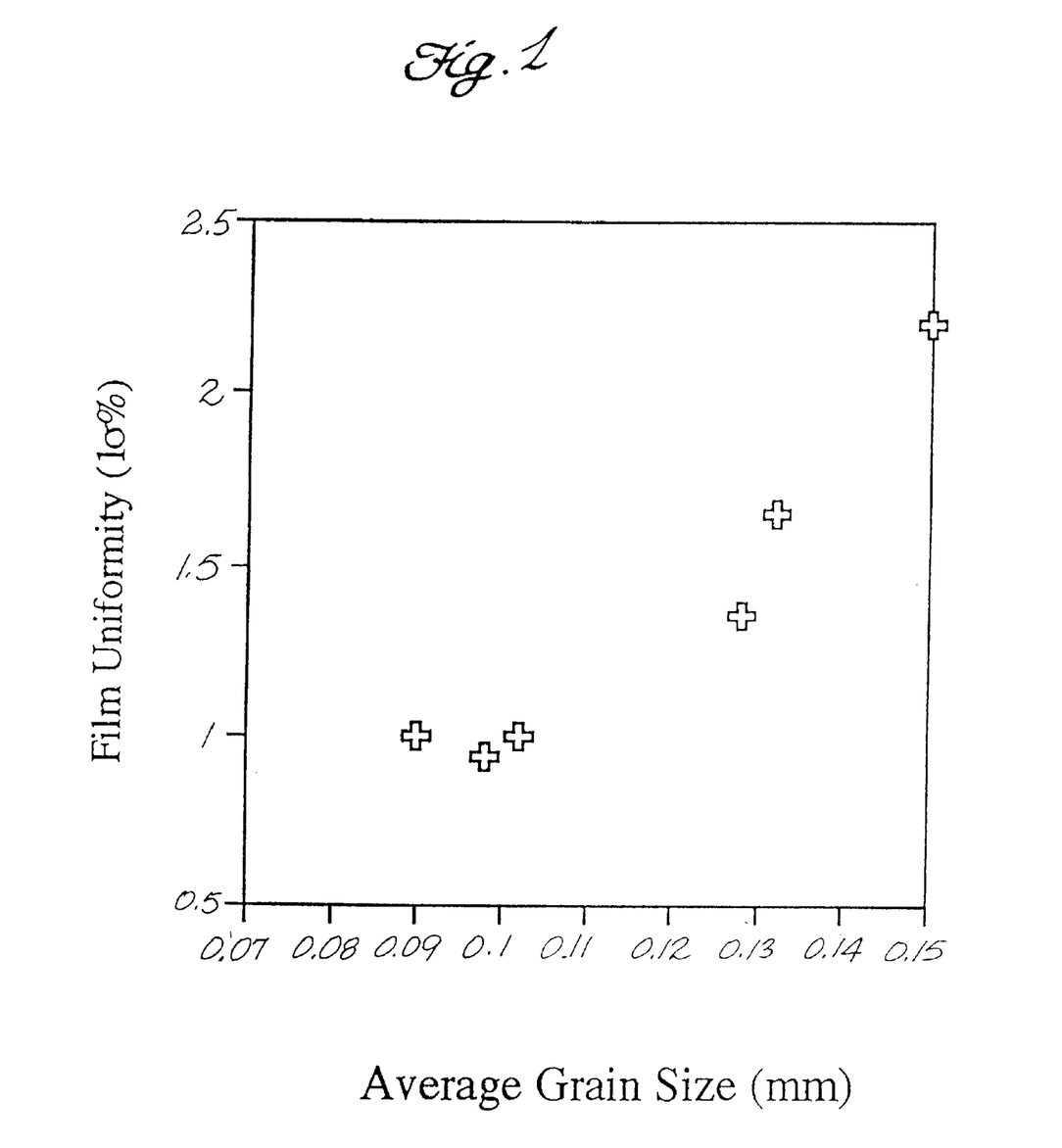
FIG. 1 shows the correlation between grain size and sputtered film (i.e., deposit) uniformity.

It is believed there are three parameters of target structure which are related to sputtering effectiveness. One factor is grain size since, rather than being one continuous crystal structure, solid metals are typically composed of separate and discrete grains of continuous crystal lattice. Depending on the composition and forming method of the metal, these grains can vary in size from the millimeter range to the micron range. Target grain size is also important to achieve high deposition rates and uniform deposited layers. Targets with fine grain sizes also enable higher deposition rates than targets with larger grain sizes because discontinuities at grain boundaries are more readily attacked during sputtering. Correlations have been found between grain size of targets and uniformity of deposited layers as shown in FIG. 1.

A second, more important, factor is the crystallographic orientation of the grains. Each grain is a continuous crystal, with its crystal lattice oriented in some particular way relative to a reference plane such as the sputtering surface of the target. Since each grain is independent of the others, each grain lattice has its own orientation relative to this plane. When grain orientation is not random, but when crystal planes tend to be aligned in some way relative to a reference plane, the material is said to have "texture". These textures are denoted using standard indices which define directions relative to crystallographic planes. For instance, a target made from a metal with cubic crystal structure, such as aluminum or copper, may have a <100>, a <110> or other textures. Similarly, a target made from a metal with hexagonal crystal structure, such as titanium, may have a <0002> texture. The exact texture developed will depend on the metal type and the work and heat treatment history of the target. The effect of crystallographic orientation of a sputtering target on sputtering deposition rate and film uniformity has been described in an article by C. E. Wickersham, Jr., entitled *Crystallographic Target Effects in Magnetron Sputtering* in the J.Vac. Sci. Technol. A5(4), July/August 1987 publication of the American Vacuum Society. In this article, the author indicates that improvements in film uniformity may be achieved on a silicon wafer by controlling the working process for making a target.

A third parameter, applicable to alloy targets, is the size of those regions in the target which comprise a second phase constituent rather than the matrix metal. Although a portion of the alloying element is dissolved into the matrix material, some "precipitate", may be distributed throughout the matrix. Certain precipitates are associated with particulates during sputtering, which may cause yield losses during the manufacture of integrated circuits. Minimizing precipitate size can also affect sputtering performance of alloy targets.

However, there is a limit to how fine a grain size, how strong a texture, and how small a precipitate size can be achieved with conventional metal processing techniques for each metal system and alloy. For example, in the case of aluminum, it is common for a target to have a grain size of 100 microns to 1 millimeter with a less-than-optimum crystallographic orientation. Grain sizes may be reduced by using grain refiners such as titanium diboride, but these materials should not be present in sputtering targets because they contaminate the sputtered deposit. Those alloy elements which may be desirable components of a sputtered deposit do not have a sufficient grain refining effect to produce optimum target grain size.

To improve the performance of sputtering targets, manufacturers have used special casting techniques to reduce the resulting as-cast grain size. Also, deformation followed by recrystallization has been used to reduce the grain size of the metal to be formed into a sputtering target.

Grain orientation control has also been suggested. A slow hot forging technique which produces a predominately <110> texture is described in U.S. Pat. No. 5,087,297 to Pouliquen.

Conventional casting, forming, annealing, and forging techniques have produced sputtering targets with limited minimum grain sizes such as is set forth in Table I below:

TABLE I

Typical Minimum Grain Sizes from
Conventional Metal Working Techniques

| Target Metal | Minimum Conventional Grain Size | Minimum Conventional Precipitate Size |
| --- | --- | --- |
| Aluminum, Aluminum Alloys | ~100 microns | ~10 microns |

TABLE I-continued

Typical Minimum Grain Sizes from
Conventional Metal Working Techniques

| Target Metal | Minimum Conventional Grain Size | Minimum Conventional Precipitate Size |
| --- | --- | --- |
| Titanium | ~10 microns | N/A |
| Copper | ~30 microns | N/A |

Metals with relatively small grains have been produced by a technique known as liquid dynamic compaction (LDC), but not in the production of sputtering targets. Porosity levels traditionally associated with spray forming methods would suggest that such methods are not suitable for sputtering target manufacture since porosity is completely undesirable. The LDC method can be adapted to produce fine grain size and very low porosity levels but prior to this invention there had been no use of the LDC process for making targets even though, as now discovered, the single step LDC process is lower cost than processes used heretofore for target manufacture. LDC involves gas atomizing molten metal to produce a fast moving spray of liquid metal droplets. These droplets splat quench upon impact with a substrate. Fragmentation and fast cooling nucleate small crystals to yield fine grains with ultra fine dendritic structure. As the atomized metal is sprayed onto a substrate, a highly dense (greater than 99% dense) metal product can be formed with grain size approximately one to two orders of magnitude smaller than produced by other conventional powder production methods. It is also possible to keep precipitate sizes below 1 micron. For example, in aluminum alloys, grain sizes less than 10 microns and precipitate sizes of less than 1 micron may be obtained. LDC is also the only known method capable of producing sputtering targets (high density targets with low oxygen content) with random texture, which may be valuable for step coverage and via fill.

Ultra-fine grains have also been achieved with a technique known as equal channel angular extrusion (ECAE), but not in production of sputtering targets. Prior to the present invention, the ECAE process has been a technical curiosity but has not been used for any known commercial purpose. Even experienced aluminum extruders considered such a process to be non-commercial and beyond their realm of experience. ECAE is a method which uses an extrusion die containing two transversely extending channels of substantially identical cross section. It is common, but not necessary, to use channels which are perpendicular to each other, such that a cross section of the transverse channels forms an "L" shape.

In this technique, a well lubricated workpiece of metal, usually in the form of a plate, is placed into one of the channels. The workpiece cross section is substantially identical to the channel cross section, so that the workpiece fits tightly into the channel. A punch then forces the workpiece to exit the die through a second contiguous transverse channel. As the workpiece is forced through the corner formed by the contiguous channels, it moves through as a rigid material, and deformation is achieved by simple shear in a thin layer at the crossing plane of the channels. This shearing and subsequent heat treatment is effective in reducing grain size in the workpiece metal to approximately 2 to 3 orders of magnitude smaller than the other currently available methods for achieving small grain size.

Although structural applications have been proposed for metals formed by these two techniques, neither LDC nor ECAE have been used in the formation of sputtering targets. In accordance with the invention these techniques are applied with appropriate materials in a manner which creates sputtering targets with improved grain sizes, textures, and precipitate sizes. Use of such improved targets results in improved sputtering deposition rates and sputtered film quality.

SUMMARY OF THE INVENTION

The present invention provides a sputtering target comprising a body of a metal such as aluminum, copper and titanium, each alone or alloyed with a dissimilar metal selected from the group consisting of copper, silicon, zirconium, titanium, tungsten, platinum, gold, niobium, rhenium, scandium, cobalt, molybdenum, hafnium, and alloys thereof, in which the grains of the major constituent measure less than about 20 microns, for an aluminum body, less than about 30 microns for a copper body and less than 10 microns for a titanium body. For aluminum alloys precipitate regions present may be less than about two microns, preferably less than about one micron.

Also provided is a method of making a sputtering target comprising melting a metal selected from the group consisting of aluminum, copper, platinum, gold, niobium, zirconium, titanium, tungsten, tantalum, rhenium, scandium, cobalt, molybdenum, hafnium, and alloys thereof, atomizing the molten metal, producing a preform from the atomized metal, and fabricating the preform into a sputtering target. In a presently preferred embodiment the target may comprise aluminum with up to ten weight percent of a metal selected from the group consisting of copper, silicon, zirconium, titanium, tungsten, platinum, gold, niobium, rhenium, scandium, cobalt, molybdenum, hafnium, and alloys thereof, or may also comprise copper with up to ten weight percent of a metal selected from the group consisting of chromium, niobium, titanium, tungsten, tantalum, molybdenum, and alloys thereof, or titanium with up to fifty weight percent of a metal selected from the group consisting of tungsten, aluminum, and alloys thereof.

Another method of making a sputtering target comprises extruding a workpiece of metal through a die having inlet and outlet contiguous, transverse channels of substantially identical cross section, whereby the workpiece enters the inlet channel and exits the outlet channel, and fabricating the extruded article into a sputtering target. The extrusion step may be repeated one or more times, before fabrication, to produce particularly small grain size, and to produce specific, desired textures.

BRIEF DESCRIPTION OF THE DRAWINGS

This file of this patent contains at least one drawing executed in color. Copies of this patent with color drawing(s) will be provided by the Patent and Trademark Office upon request and payment of the necessary fee.

FIG. 9 is the standard micrograph and FIG. 10 is the ECAE micrograph.

DETAILED DESCRIPTION

Metal sputtering targets that are commonly available to the industry have grain size limitations as shown in Table 1 above, and varying degrees of texture and dominant crystallographic orientation. Such targets may be obtained by casting and working the metal followed by recrystallization heat treatment at an elevated temperature. Alternatively, high-melting-temperature target materials may also be formed by compacting and heating fine powders at elevated temperatures. Metal made from these various techniques is produced in the form of a target blank, i.e., workpiece, which is fabricated into a suitable sputtering target. Various metals and metal compositions may be used; including high purity aluminum, copper and titanium, and their alloys, such as aluminum-silicon-copper alloys, and other copper or titanium alloys, e.g., titanium-tungsten alloys.

The following are examples of the present invention by reference to the accompanying drawings.

FIG. 1 is a chart showing the film uniformity versus average grain size of six targets of aluminum and 0.5 weight percent copper targets made by conventional process involving rolling and recrystallization of ingots and illustrates uniformity values as they correlate with a range of grain sizes in conventional products.

Figure 2:
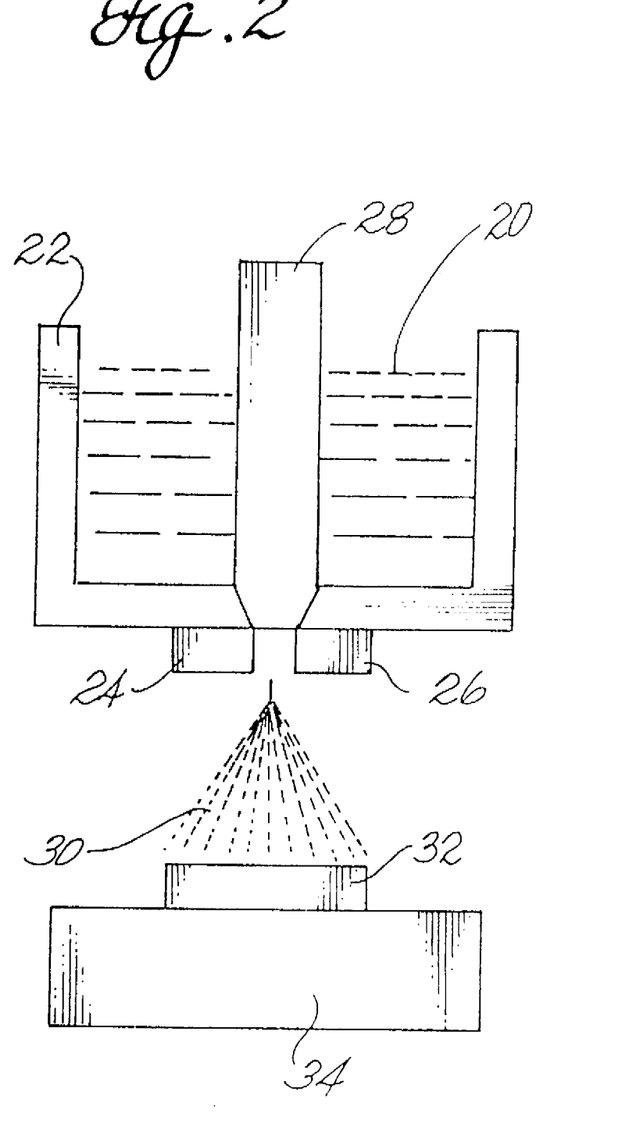
FIG. 2 is a diagrammatic illustration of an apparatus for forming a workpiece of metal using the liquid dynamic compaction ("LDC") technique.

FIG. 2 describes an embodiment of the invention wherein a metal, such as an alloy of aluminum with 0.5 weight percent copper, is melted in a crucible 22 with a suitable heating element to produce metal to be used in making a sputtering target. The molten metal 20 and crucible 22 comprise part of a liquid dynamic compaction apparatus. Atomizing jets 24 and 26 are provided near an opening in the bottom of the crucible 22 and are supplied with a high pressure gas to atomize the metal as it flows through the crucible opening. The flow of metal through the opening is controlled through a stopper 28. The molten metal is atomized into a downwardly directed spray 30, and forms a workpiece 32 as it builds in thickness on a substrate 34.

The mass flow ratio (ratio between the mass flow rate of the atomizing gas and the mass flow rate of the molten metal), the superheat of the molten metal, the atomizing gas pressure, and the nozzle to substrate spacing must all balance to produce a solid, dense compact rather than a powder. The mass flow ratio tends to increase as pressure increases, and grain size will be smaller. However, too high a pressure will cause porosity. Lower superheats will tend to require that nozzle to substrate spacings be lowered, and may cause porosity problems as well. On the other hand, too high a superheat will make it difficult to extract heat quickly, and grain size will go up. An illustrative set of conditions that would apply for an aluminum alloy sputtering target are shown in the Table below:

TABLE II

Typical Spray Parameters for Aluminum Alloy Targets

| | |
|---|---|
| Superheat | 100° C. to 400° C. |
| Atomizing Pressure | 80 to 800 psig |
| Nozzle to Substrate Spacing | 20 to 40 cm |
| Ratio of Gas to Metal Mass Flow Rate | 0.2 to 0.6 |

Figure 3:
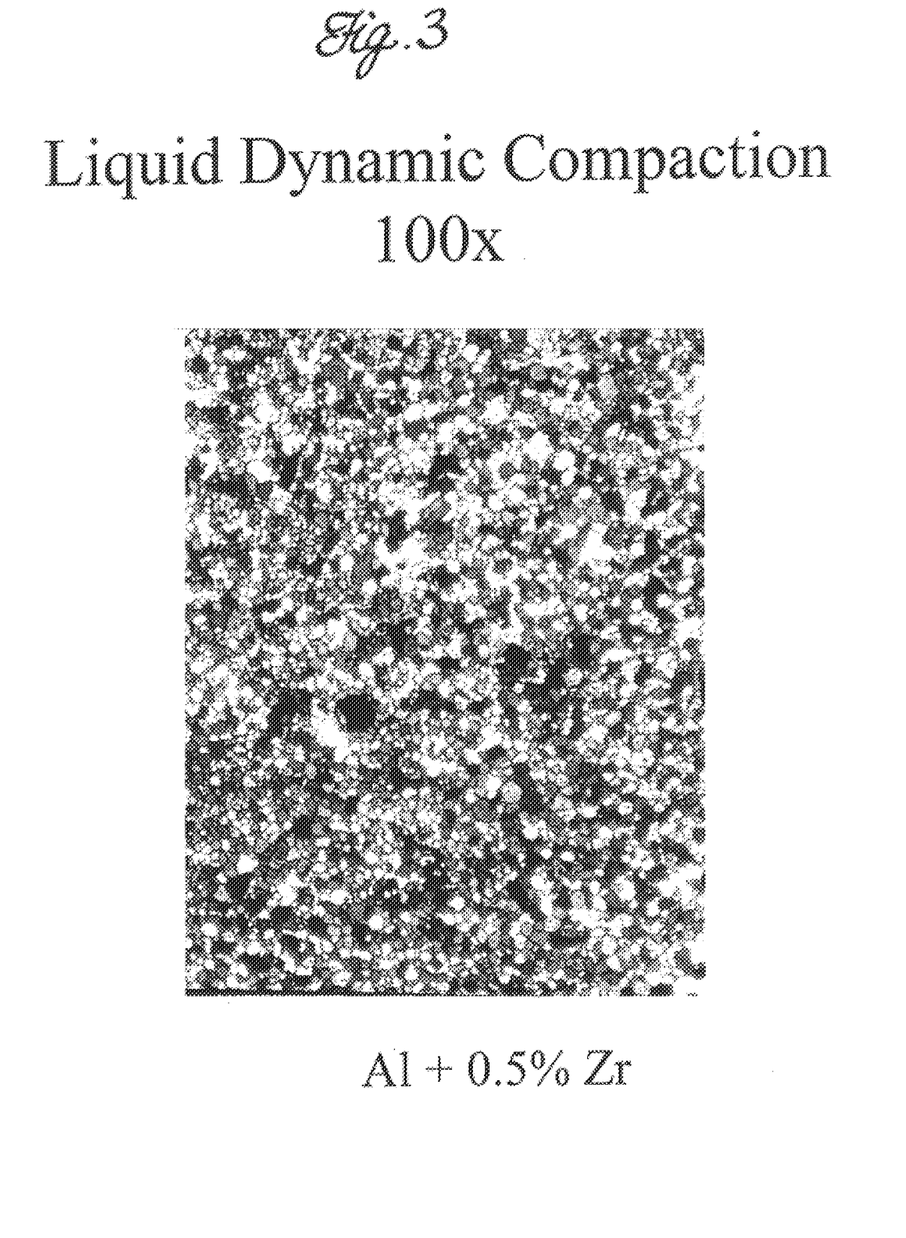
FIGS. 3 and 4 are photomicrographs of Al+0.5 wt. % Zr produced by the LDC process and Al+0.5 wt. % Cu produced by continuously casting, respectively.
Figure 4:
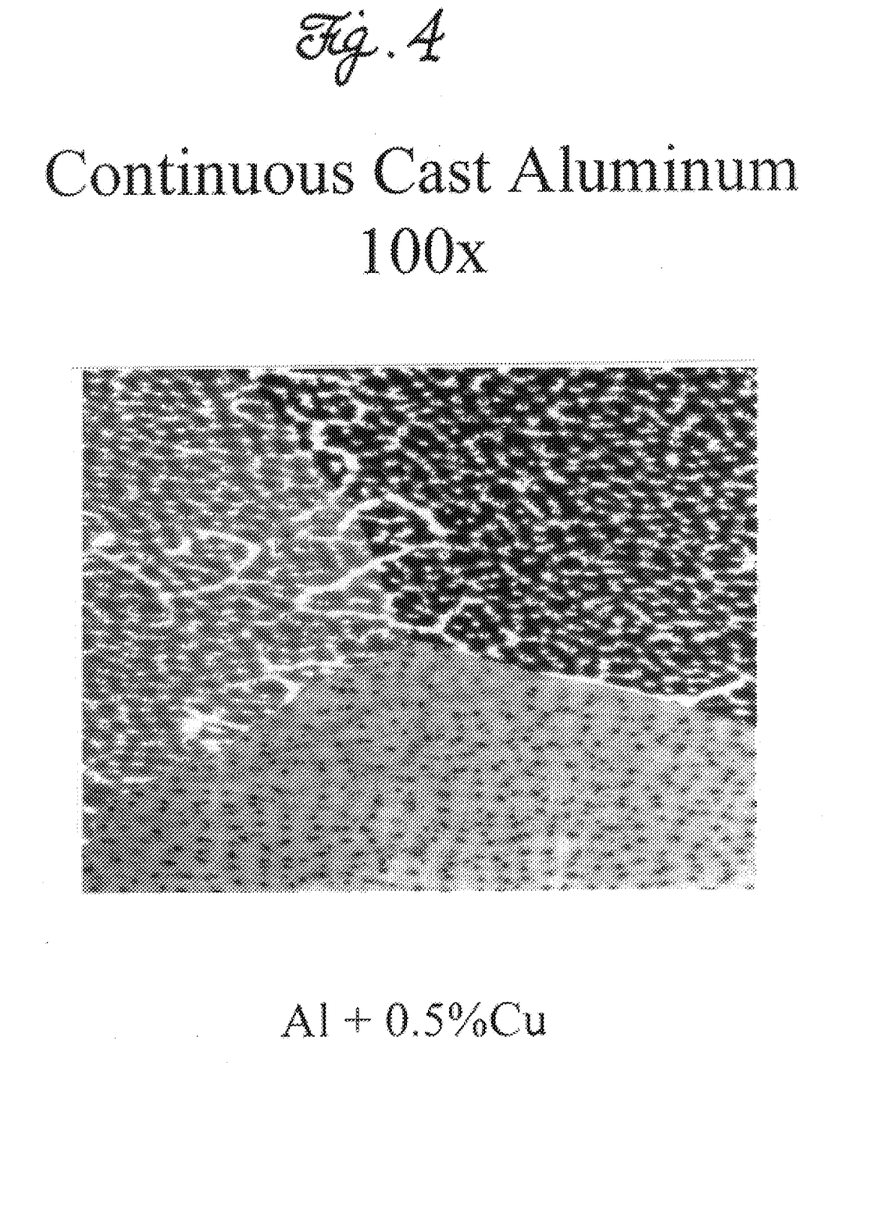

The photomicrographs in FIGS. 3 and 4 contrast nicely with the grain sizes obtained by Liquid Dynamic Compaction and by continuous casting methods. As can be seen, LDC produces small precipitates and can provide a better dispersion of alloying elements, thus avoiding gross precipitation of alloying elements such as results from continuous casting.

As an example, the above-described atomization process may be used to produce an aluminum-copper workpiece with randomly oriented aluminum-copper alloy grains about ten microns in size, and without dendritic structures visible in these grains at 100×magnification. In contrast, conventional casting methods produce grains in the millimeter range with a distinct dendritic structure. Moreover, conventionally cast aluminum also tends to have a certain degree of <100> texture because this axis tends to align with the heat flow during cooling. Though random grain orientation may not produce an optimum sputtering target for certain purposes, a workpiece with randomly oriented grains (i.e., no texture) is believed to be a desirable starting material for subsequent forming techniques directed to orienting the grains to produce a desired texture for sputtering targets. In addition, random orientation may be optimum for certain sputtering conditions. Workpieces produced in this manner also exhibit few precipitate regions measuring more than one micron. With conventional casting techniques, much larger precipitates of the second phase material are produced.

Although aluminum with copper is one material that may be fabricated into a sputtering target with the LDC technique, many other materials also may be used. Aluminum, copper, titanium, zirconium, tantalum, tungsten, rhenium, scandium, cobalt, molybdenum, hafnium, and alloys thereof, may be desirable materials for sputtering targets for the electronics industry and workpieces of these metals and their respective alloys could also be produced in a manner similar to aluminum-copper workpieces described above. LDC is also especially useful in creating sputtering targets with unusual alloy combinations, such as aluminum and titanium, tungsten, tantalum, rhenium, scandium, cobalt, molybdenum, and hafnium, as well as other elemental combinations, to avoid problems of precipitation from the matrix phase during cooling in conventional casting techniques, or creating precipitate regions too large for use as acceptable sputtering targets. The LDC process allows the creation of alloys of these metals with very small precipitates and targets with high concentrations of the alloying elements may thus be created. Although alloys with over 90 weight percent of the matrix metal are typical, lower concentrations of matrix metal could also be produced with this technique for sputtering targets.

To make target fabrication easier, the substrate 34 in FIG. 1 may be moved during preform formation as the atomized metal is being deposited, to control the location of material so that the shape of the preform is closer to that desired in the finished sputtering target (known as "near net shape forming") by avoiding undesirable buildup. The preform can be fabricated into a sputtering target of a variety of shapes, annular rings being a common form by fabricating, e.g., machining.

The as-deposited texture of an LDC preform is random, as evidenced by the orientation distribution function in FIG. 5. The random texture may provide benefits in the ability of the sputtering target to fill vias and provide good step coverage.

However, depending on the requirements of the desired films and the sputtering deposition system, subsequent processing may be required. One possibility is to hot forge the preform to create oriented grains as is described in U.S. Pat. No. 5,087,297. Another alternative is to achieve both additional reduction in grain size and desired grain orientation by using the ECAE technique on the LDC formed preform, as discussed below.

Figure 6:
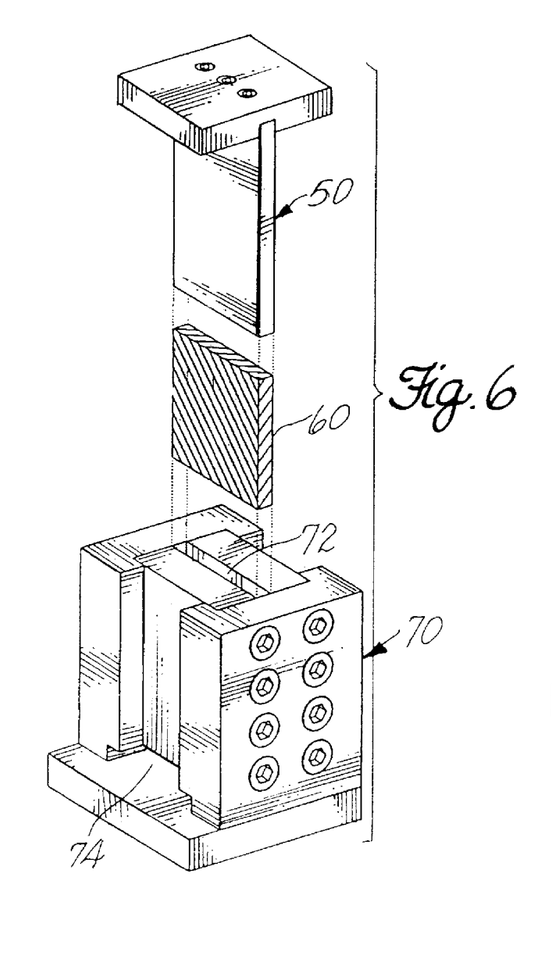
FIG. 6, 7 and 8 are diagrammatic illustrations of an apparatus for extruding a workpiece of metal using the equal channel angular extrusion technique ("ECAE"), in different stages, respectively.
Figure 7:
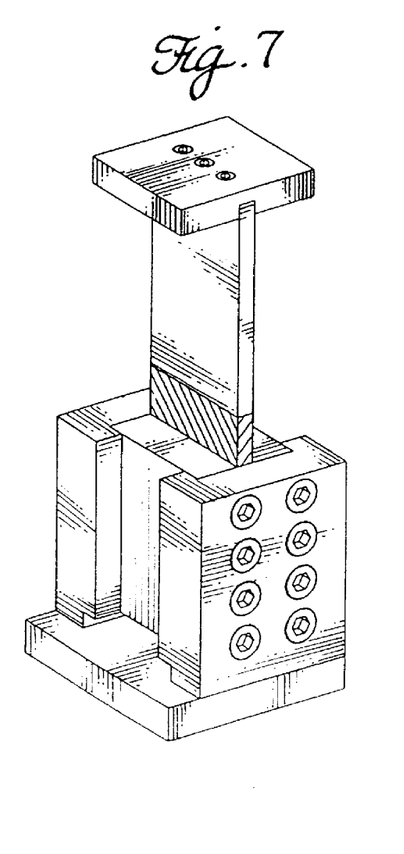
Figure 8:
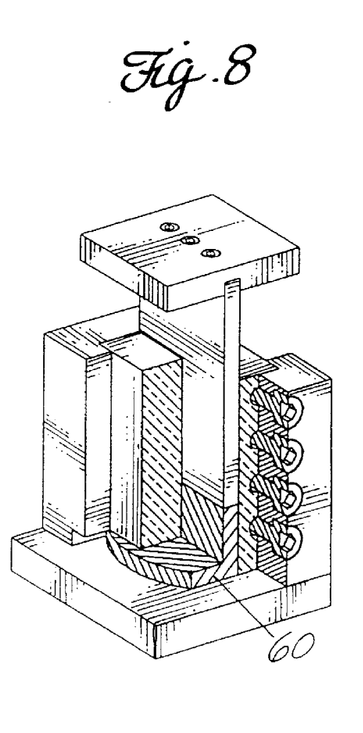

The diagrammatic illustrations in FIGS. 6, 7 and 8 illustrate the practice of the invention to produce material for targets by the ECAE method. As shown in these figures, where like numerals refer to like parts, the process is performed using an apparatus comprising a ram 50 and a ECAE die 70. The die includes an inlet channel 72 and an outlet channel 74, transverse but contiguous to inlet channel 72. A workpiece, 60, which may comprise a workpiece produced by the LDC process illustrated in connection with FIG. 1, is extruded through the die. FIGS. 6, 7 and 8 show different stages of production comprising, respectively; the workpiece, die and ram before loading; the workpiece sliding down into the die with ram following (no force is exerted at this point); and a cut-away view of a partially extruded workpiece in the die partially exiting the outlet channel.

In an embodiment shown in FIGS. 6, 7 and 8, the preform created by LDC is a substantially square plate 60, e.g., nominally seventeen inches on a side and one inch thick. The channels of the steel extrusion die 72 and 74, are of substantially identical cross section as the plate having, in this example, a cross section of seventeen inches by one inch, such that the plate fits tightly when inserted edgewise into the inlet channel 72. The outlet channel 74 is contiguous and extends from the inlet channel 72, and is of substantially identical cross section as the first channel. In this example the channels are substantially perpendicular but the channels may be at angles greater than 90°. The channels are oriented relative to each other such that upon entry into the inlet channel, the large faces of the workpiece are vertical, and upon exit from the outlet channel, the large faces of the workpiece are horizontal. Each channel terminates at the channel intersection such that the two transverse channels form a single contiguous passageway with an "L" shaped longitudinal cross section.

The workpiece 60 is advantageously lubricated with any known anti-seize lubricant, so that a ram 50 presses the workpiece into the inlet channel 72. When the workpiece reaches the end of the inlet channel, the ram continues pressing the workpiece, causing it to shear along the plane of intersection of the two channels. As the ram continues to press down on the workpiece, the workpiece is forced to exit the die through the outlet channel 74, continually shearing along the channel intersection plane as it passes through the intersection. The ram is then retracted, and the workpiece is pulled out of the outlet channel. Although the illustration shows the inlet and outlet channels at 90° to each other, the channels may be at other angles.

There are many advantages of this technique over conventional roll or forge-type forming. One advantage is that there is a large effective deformation with each pass. Two passes through an ECAE die can produce an equivalent area reduction of ninety percent. This large deformation reduces grain size with fewer passes than is possible with traditional in-line extrusion methods and deformation is also uniform throughout the extruded workpiece except at the surface. Such results are very difficult to achieve using conventional methods.

The punch pressures required to perform an ECAE extrusion are much less than those required for traditional extrusion techniques, typically the ratio of punch pressure to the flow stress for a 90° angle is 1. In addition, because the extruded workpiece is of the same size and shape as the preform prior to extrusion, there is little or no waste of material such as occurs during extensive area reductions by roll or forge forming.

For an aluminum and 0.5 wt. % copper alloy workpiece, equal channel extrusion and subsequent heat treatments up to 400° C. for three hours has shown no discernible grains under an optical microscope at 1000×magnification. However, X-ray diffraction has indicated a grain size of approximately one micron. Similar heat treatment after a conventional deformation processes results in grain sizes of 100 microns or greater.

Of particular interest in the manufacture of sputtering targets is the production of controlled textures using the ECAE process. The texture can be controlled by varying temperature, rate and number of subsequent repeated ECAE extrusions on the same workpiece. If the workpiece is rotated so that different edges are inserted initially into the ECAE die, the shear plane is oriented differently relative to the workpiece. Thus, by rotating or "flipping" the workpiece prior to some or all re-insertions into the extrusion channel, to perform a predetermined sequence of extrusions, a final extruded product with a particular texture suitable for a particular sputtering target can be obtained. Thus, by changing the sequence of workpiece orientations in subsequent re-extrusions, different textures can be created which are especially suitable for specific target applications.

Figure 9:
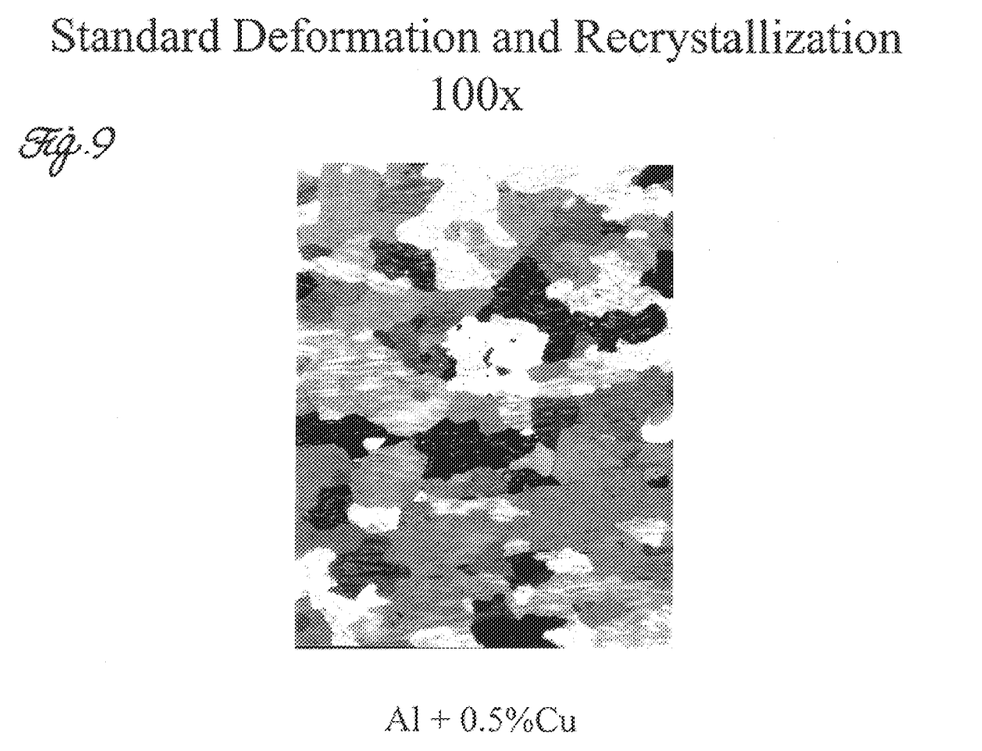
FIGS. 9 and 10 are photomicrographs of Al+0.5. wt. % Cu produced by standard deformation and recrystallization and by the ECAE process; respectively; where
Figure 10:
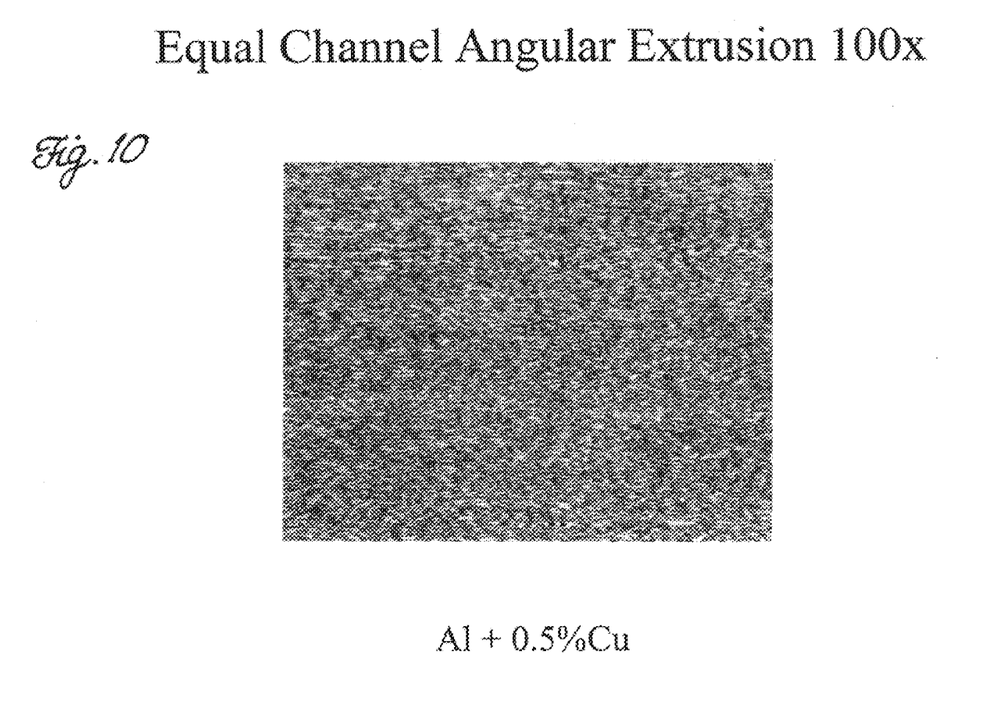

The photomicrographs shown as FIGS. 9 and 10 illustrate the different metallurgical structure achievable by the ECAE process. The structure of the standard rolled and crystallized material (FIG. 9) is not nearly as fine or as ordered as the ECAE product (FIG. 10), for the same composition.

Certain textures are known to be desirable for different purposes. For example, for deposited film thickness uniformity, in the manufacture of aluminum alloy targets with a planar sputtering surface, it has been found that it is desirable to have more grains with {200} planes approximately parallel to the target sputtering surface than grains with {220} planes facing or parallel to the target sputtering surface. In contrast, aluminum targets with conical sputtering surfaces have been found to perform better when there are fewer grains with {200}, planes facing or approximately parallel to the target sputtering surface than grains with {220} planes facing or parallel to the target sputtering surface. Other desired deposited film characteristics (step coverage, via fill, etc.) will require different textures or even random orientation.

Figure 11:
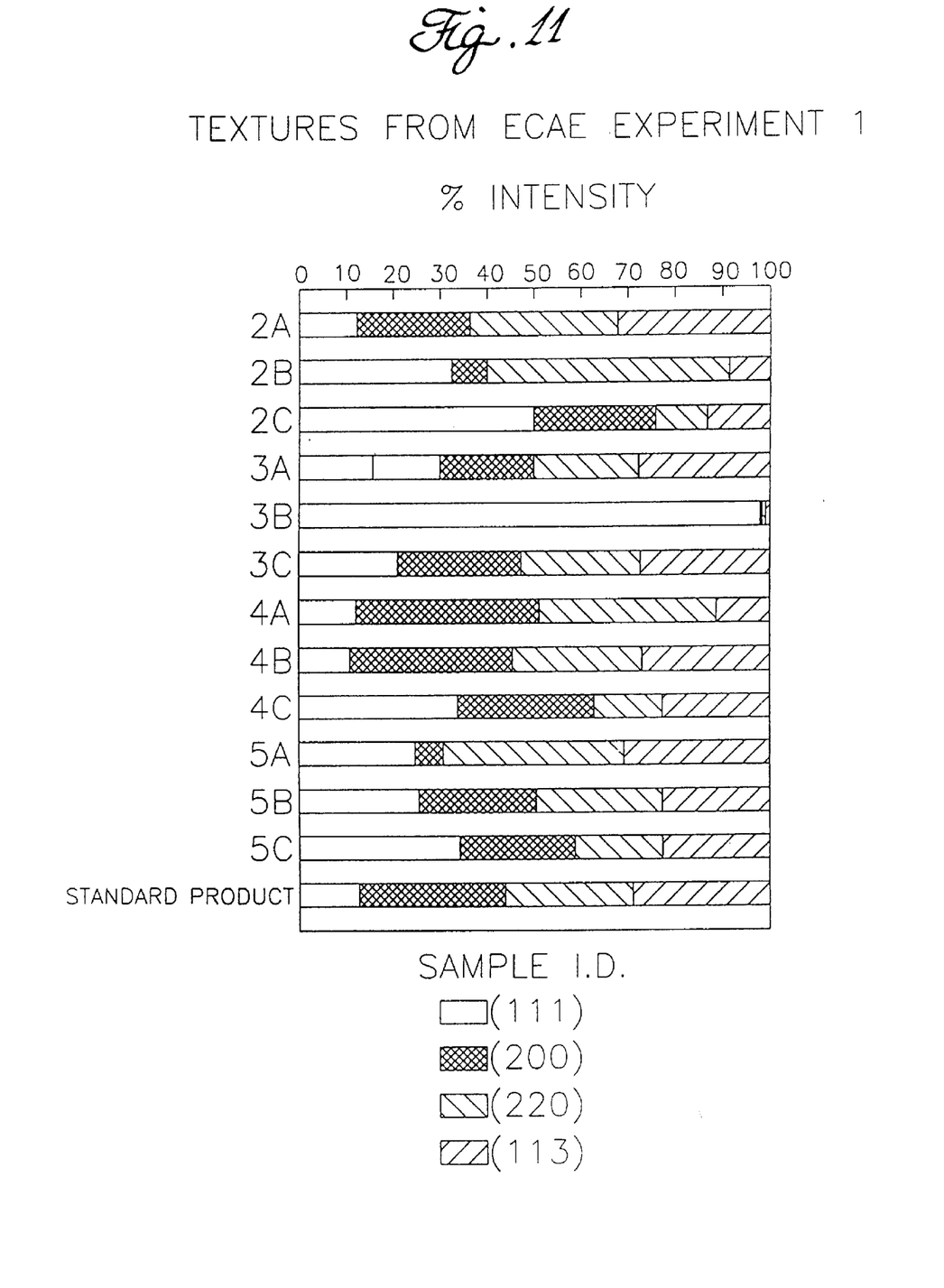
FIG. 11 illustrates the results of X-ray diffraction tests on aluminum workpieces formed with the techniques described. The relative preponderance of different grain orientations is shown.

A determination of material texture is typically made by an X-ray diffraction measurement. These measurements are shown in FIG. 11 for twelve different sets of ECAE extrusions and a sputtering target formed with previously known techniques. Depicted in FIG. 11 are the relative intensities of reflected X-rays corresponding to different grain lattice orientations relative to a workpiece surface. As can be seen, a wide variety of grain orientations are possible.

Of special interest are samples 2B and 2C in FIG. 11. Sample 2B exhibits a much stronger {220} intensity than {200}. When {220} intensity is greater than {200} intensity, the sample exhibits predominantly <220> texture perpendicular to the target surface. In contrast, sample 2C exhibits a much stronger {200} intensity than {220}. When {200} intensity is greater than {220} intensity, the sample exhibits predominantly <200> texture perpendicular to the target surface. Strong <220> texture is associated with high quality conical aluminum sputtering targets that provide good sputtered film uniformity, whereas strong <200> texture is associated with planar aluminum sputtering targets that provide good sputtered film uniformity.

It should be emphasized that the LDC and ECAE techniques are not limited to aluminum and aluminum alloys although these metals are especially useful for sputtering targets in the electronics industry. Targets of almost any metal can be produced in this manner by the described combination of LDC atomization and ECAE extrusion, however, suitable ultra-fine grain targets can be produced with either LDC or ECAE separately. It is not necessary to use them both in conjunction.

The invention also lends itself to the application of nanoscale technology in the manufacture of ultrafine grain targets. For example, the desired target metal may be vaporized and condensed to form very fine, i.e., micron diameter, particles followed by compacting and heating the particles to form a solid sputtering target with fine grain size.

It is apparent from the foregoing that various changes and modifications may be made to the invention without departing from its spirit. Accordingly, the scope of the invention should be limited only by the appended claims and their equivalents.

What is claimed is:

1. A method for making a sputtering target comprising:
    melting a metal;
    atomizing the molten metal to produce metal droplets;
    collecting the metal droplets on a substrate to produce a workpiece;
    extruding the workpiece through a die containing contiguous, transverse inlet and outlet channels of substantially identical cross section, whereby the workpiece enters the inlet channel and exits the outlet channel to produce an extrusion; and
    fabricating the extrusion into a sputtering target.

2. The method of claim 1 wherein the metal comprises aluminum with up to 10 weight percent of at least one metal selected from the group consisting of copper, silicon, zirconium, titanium, tungsten, platinum, gold, niobium, rhenium, scandium, cobalt, molybdenum, hafnium, and alloys thereof.

3. A sputtering target made by the method of claim 2.

4. A method for making a sputtering target comprising:
    (a) melting a metal;
    (b) atomizing the molten metal;
    (c) producing a workpiece from the atomized metal;
    (d) extruding the workpiece through a die having contiguous, transverse inlet and outlet channels of substantially identical cross section, whereby the workpiece enters the inlet channel and exits the outlet channel, to produce an extruded article;
    (e) repeating the extrusion step (d) one or more times to produce a final extruded article with a desired texture; and
    (f) fabricating the final extruded article into a sputtering target.

5. The method of claim 4, wherein the metal comprises aluminum with up to 10 weight percent of a metal selected from the group consisting of copper, silicon, zirconium, titanium, tungsten, platinum, gold, niobium, rhenium, scandium, cobalt, molybdenum, hafnium, and alloys thereof.

6. A method for making a sputtering target comprising:
    (a) melting a metal comprising aluminum or aluminum alloy;
    (b) atomizing the molten metal;
    (c) producing a workpiece from the atomized metal;
    (d) extruding the workpiece through a die having contiguous, transverse inlet and outlet channels of substantially identical cross section, whereby the workpiece enters the inlet channel and exits the outlet channel;
    (e) repeating the extrusion step (d) one or more times to produce a final extruded article with predominantly <200> texture; and
    (f) fabricating the final extruded article into a sputtering target.

7. The method of claim 6 wherein the metal comprises aluminum with up to 10% of at least one metal selected from the group consisting of copper, silicon, zirconium, titanium, tungsten, platinum, gold, niobium, rhenium, scandium, cobalt, molybdenum, hafnium, and alloys thereof.

8. A method for making a sputtering target comprising:
    (a) melting a metal comprising aluminum or aluminum alloy;
    (b) atomizing the molten metal;
    (c) producing a workpiece from the atomized metal;
    (d) extruding the workpiece through a die having contiguous, transverse inlet and outlet channels of substantially identical cross section, whereby the workpiece enters the inlet channel and exits the outlet channel;
    (e) repeating the extrusion step (d) one or more times to produce a final extruded article with predominantly <110> texture; and
    (f) fabricating the final extruded article into a sputtering target.

9. The method of claim 8 wherein the metal comprises aluminum with up to 10 weight percent of at least one metal selected from the group consisting of copper, silicon, zirconium, titanium, tungsten, platinum, gold, niobium, rhenium, scandium, cobalt, molybdenum, hafnium, and alloys thereof.

10. A method for making a sputtering target comprising:
    melting a metal;
    atomizing the molten metal to produce metal droplets;
    collecting the metal droplets on a substrate to produce a workpiece;
    extruding the workpiece through a die containing contiguous, transverse inlet and outlet channels of substantially identical cross section, whereby the workpiece enters the inlet channel and exits the outlet channel to produce an extrusion having a predominantly <200> or <220> texture; and
    fabricating the extrusion into a sputtering target.

11. The method of claim 10 wherein the metal comprises aluminum with up to 10 weight percent of at least one metal selected from the group consisting of copper, silicon, zirconium, titanium, tungsten, platinum, tantalum, gold, niobium, rhenium, scandium, cobalt, molybdenum, hafnium, and alloys thereof, substantially all aluminum grains measuring less than about 20 microns.

12. The method of claim 11 wherein the target includes precipitate regions and substantially all precipitate regions measure less than about one micron.

13. The method according to claim 11 wherein all aluminum grains in the extruded workpiece measure less than about 2 microns.

14. A sputtering target made by the method of claim 10.
15. A sputtering target made by the method of claim 11.
16. A sputtering target made by the method of claim 12.
17. A sputtering target made by the method of claim 13.

* * * * *

UNITED STATES PATENT AND TRADEMARK OFFICE
CERTIFICATE OF CORRECTION

Figure 5A:
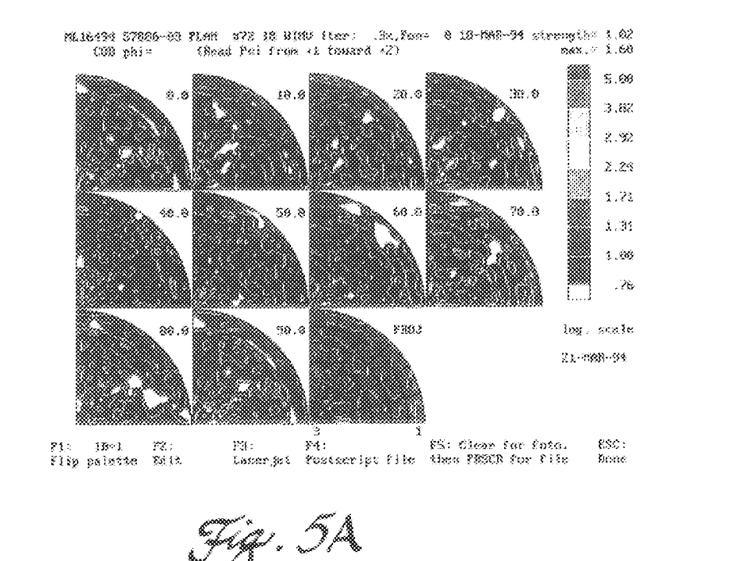
FIG. 5 shows orientation distribution functions from as sprayed LDC material.
Figure 5B:
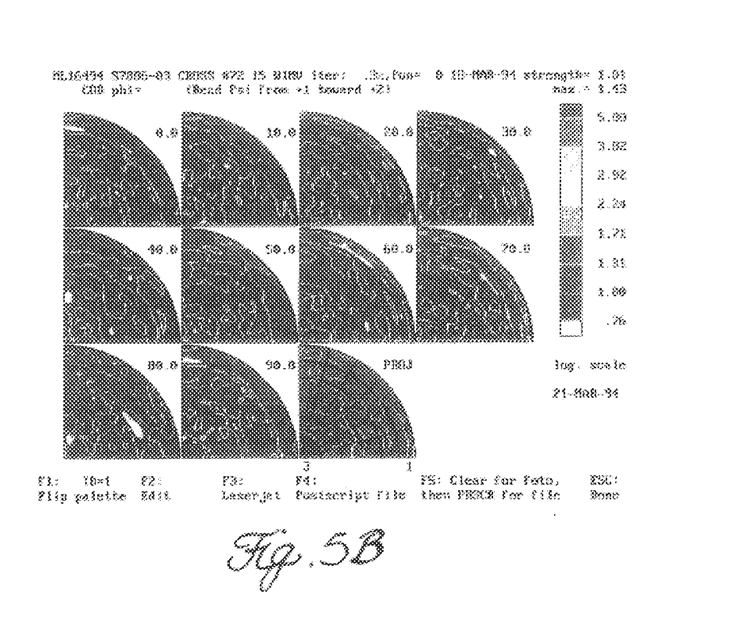

PATENT NO. : 5,809,393
DATED : September 15, 1998
INVENTOR(S) : John Alden Dunlop; Jun Yuan; Janine Kiyabu Kordokus; Roger Alan Emigh It is certified that error appears in the above-identified patent and that said Letters Patent is hereby corrected as shown below:

Column 4, line 51, change "This file" to -- The file --.
Column 4, line 64, replace "FIG. 5 shows" with -- FIGS. 5A and 5B show --.
Column 7, line 5, replace "FIG. 5" with -- FIGS. 5A and 5B --.

Signed and Sealed this

Twelfth Day of October, 1999

Q. TODD DICKINSON

*Attest:*

*Attesting Officer*                 *Acting Commissioner of Patents and Trademarks*